US009850384B2

(12) United States Patent
Rueger

(10) Patent No.: US 9,850,384 B2
(45) Date of Patent: Dec. 26, 2017

(54) TRANSPARENT, ELECTRICALLY SEMICONDUCTING INTERFERENCE TIO$_x$ PIGMENTS WITH HIGH COLOR STRENGTH

(71) Applicant: MERCK PATENT GMBH, Darmstadt (DE)

(72) Inventor: Reinhold Rueger, Roedermark (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/899,314

(22) PCT Filed: May 28, 2014

(86) PCT No.: PCT/EP2014/001435
§ 371 (c)(1),
(2) Date: Dec. 17, 2015

(87) PCT Pub. No.: WO2014/202179
PCT Pub. Date: Dec. 24, 2014

(65) Prior Publication Data
US 2016/0137846 A1 May 19, 2016

(30) Foreign Application Priority Data

Jun. 17, 2013 (EP) ..................................... 13003084

(51) Int. Cl.
| | | |
|---|---|---|
| C01G 23/04 | (2006.01) | |
| C09C 1/00 | (2006.01) | |
| C09C 1/36 | (2006.01) | |
| C23C 16/56 | (2006.01) | |

(52) U.S. Cl.
CPC ............ C09C 1/0018 (2013.01); C01G 23/04 (2013.01); C01G 23/043 (2013.01); C09C 1/0021 (2013.01); C09C 1/0027 (2013.01); C09C 1/36 (2013.01); C23C 16/56 (2013.01); *C01P 2002/54* (2013.01); *C01P 2004/54* (2013.01); *C01P 2006/40* (2013.01); *C01P 2006/62* (2013.01); *C01P 2006/63* (2013.01); *C01P 2006/64* (2013.01); *C09C 2200/102* (2013.01); *C09C 2200/1004* (2013.01); *C09C 2200/301* (2013.01); *C09C 2200/303* (2013.01); *C09C 2200/304* (2013.01); *C09C 2200/308* (2013.01); *C09C 2200/505* (2013.01); *C09C 2220/106* (2013.01); *C09C 2220/20* (2013.01)

(58) Field of Classification Search
CPC .. C01G 23/04; C01G 23/047; Y10T 428/2991
USPC .......................... 428/402; 423/608, 610, 611
See application file for complete search history.

(56) References Cited

U.S. PATENT DOCUMENTS

| | | | | |
|---|---|---|---|---|
| 3,771,997 | A * | 11/1973 | Clark ........................ | C22B 9/18 148/26 |
| 4,568,609 | A | 2/1986 | Sato et al. | |
| 4,948,631 | A | 8/1990 | Ostertag et al. | |
| 5,472,640 | A | 12/1995 | Brueckner et al. | |
| 5,540,769 | A * | 7/1996 | Franz ..................... | C09C 1/0015 106/415 |
| 5,597,515 | A * | 1/1997 | Kauffman .............. | B82Y 30/00 252/519.12 |
| 5,611,851 | A * | 3/1997 | DeLuca ................ | C09C 1/0018 106/415 |
| 5,624,487 | A * | 4/1997 | Schmidt ................... | A61Q 1/02 106/415 |
| 5,693,135 | A | 12/1997 | Schmidt et al. | |
| 5,985,020 | A | 11/1999 | Andes et al. | |
| 6,596,070 | B1 | 7/2003 | Schmidt | |
| 7,014,700 | B2 | 3/2006 | De Luca, Jr. et al. | |
| 7,468,175 | B2 * | 12/2008 | Kobasa .................. | B01J 21/063 423/611 |
| 2005/0154082 | A1 | 7/2005 | DeLuca et al. | |
| 2010/0011992 | A1* | 1/2010 | Bujard .................... | B82Y 30/00 106/439 |
| 2013/0248781 | A1 | 9/2013 | Rueger et al. | |
| 2016/0137847 | A1* | 5/2016 | Rueger ................ | C09C 1/0021 283/114 |

FOREIGN PATENT DOCUMENTS

| | | |
|---|---|---|
| CN | 1270615 A | 10/2000 |
| DE | 3842330 A1 | 6/1990 |
| DE | 4237990 A1 | 5/1994 |
| DE | 102010052888 A1 | 6/2012 |
| EP | 0139557 A1 | 5/1985 |
| EP | 0332071 A1 | 9/1989 |
| EP | 0359569 A2 | 3/1990 |
| EP | 0632821 A1 | 1/1995 |
| EP | 0735115 A1 | 10/1996 |
| EP | 0743654 A2 | 11/1996 |
| WO | 9533009 A1 | 12/1995 |
| WO | 9743347 A1 | 11/1997 |
| WO | 2005071018 A1 | 8/2005 |

OTHER PUBLICATIONS

Tsuyumoto, New orthorhombic titanium oxide, TiO1.94, J. of Mater. Sci. Lett. 19, 2000, 2075-2076.*
Gonzalez-Borrero, et al., Energy-level and optical properties of nitrogen doped TiO2: An experimental and theoretical study, Applied Phys. Lett. 99, 221909 (2011).*
Kallel et al., Structural and conductivity study of Y and Rb co-doped TiO2 synthesized by the sol-gel method, J. of Non-Crystalline Solids 352 (2006) 3970-3978.*

(Continued)

*Primary Examiner* — Holly Le
(74) *Attorney, Agent, or Firm* — Millen White Zelano & Branigan

(57) ABSTRACT

The present invention relates to transparent, electrically semiconducting interference pigments having high color strength, and in particular to flake-form interference pigments which comprise an oxygen-deficient layer of TiO$_{2-x}$, to a process for the preparation of such pigments, and to the use of the pigments prepared in this way.

22 Claims, No Drawings

(56) References Cited

OTHER PUBLICATIONS

Xiufeng et al., Preparation of Crystalline Sn-doped TiO2 and its application in visible-light photocatalysis, Hindawi PUblishing Corp., J. of Nanomateirals, vol. 2011, Article ID 432947 (2011).*
International Search Report for PCT/EP2014/001435 dated Sep. 18, 2014.
English Abstract of DE4237990, Publication Date: May 19, 1994.
Office Action in corresponding CN Appln. No. 2014800342 dated Mar. 1, 2017.

* cited by examiner

TRANSPARENT, ELECTRICALLY SEMICONDUCTING INTERFERENCE TIO$_x$ PIGMENTS WITH HIGH COLOR STRENGTH

The present invention relates to transparent, electrically semiconducting interference pigments having high colour strength, and in particular to flake-form interference pigments which comprise an oxygen-deficient layer of TiO$_{2-x}$, to a process for the preparation of such pigments, and to the use of the pigments prepared in this way.

In many applications of printing inks, paints, plastics, etc., it is desired to be able specifically to adjust the electrical properties of the materials. This is carried out through the use of suitable additives, such as fillers or pigments having corresponding electrical properties. Thus, it is known, for example, considerably to increase the electrical conductivity of layers which comprise dielectric binders by the addition of conducting fillers or pigments.

Besides carbon black, which has high electrical conductivity, but also a dark colour, transparent, colourless or pale-coloured electrically conducting pigments which make possible pale electrically conducting coatings, for example for floors, have recently been developed. Such pigments are generally based on mica flakes and have layers of tin oxide doped with antimony or other dopants. They are described, for example, in the patent specifications DE 38 42 330, DE 42 37 990, EP 0 139 557, EP 0 359 569 and EP 0 743 654, and are available, inter alia, from Merck KGaA under the name Mina-tec® 31 CM or Minatec® 30 CM.

However, mica flakes which are coated with doped tin oxide layers may also be pigments having semiconducting properties if the doping is modified in accordance with DE 10 201 0 052 888. The pigments described therein are uncoloured and pale. They exhibit non-ohmic electrical behaviour at high field strengths and can advantageously be employed in field-controlling insulating materials.

Since the pigments based on mica flakes described above are pale and transparent, they can be combined in the application medium with various colorants, enabling the colouring of the application medium to be varied. However, the addition of colorants may result in undesired interactions between colouring components and electrically conducting components in the application medium. Thus, electrically insulating colorants reduce the electrical conductivity of the electrically conducting additives, but the latter, in particular if they are employed in relatively large amounts, influence the colour location and colour intensity of the products through their inherent colour and light scattering. A simple increase in the respective proportions of the components for the generation of desired colour and conductivity effects is uneconomic and in addition may also result in impairment of the physical-mechanical properties, for example their viscosity, adhesion, strength or elasticity, during the processing and use of the preparations comprising them.

It is therefore desirable to have available pigments which have both an attractive colour and also defined electrically conducting properties.

EP 0 632 821 discloses flake-form coloured interference pigments which have a coating comprising titanium dioxide, one or more titanium suboxides and one or more oxides of one or more metals and/or non-metals on mica flakes. The coating here has a composition which varies gradually over its thickness. The pigments obtained are coloured and electrically conducting, but, besides interference colours, also have dark mass tones and have such a large band width of electrical conductivity that specific influencing of the latter appears improbable.

Interference pigments which comprise various titanium suboxides and optionally also titanium oxynitrides are also described, for example, in the documents EP 0 332 071 and EP 0 735 115. These pigments have a blue interference colour and a blue to blue-black mass tone.

However, in particular the dark, brown, grey or blue-black mass tones of the pigments described above considerably restrict their usability in various application media in which transparent or translucent coatings are desired. The establishment of saturated, clear interference colours at the same time as a given transparency of the coating and the presence of reliable electrical characteristic quantities represents a major challenge which has hitherto not been overcome with the aid of a single pigment.

Besides coatings which comprise electrically conducting pigments having high electrical conductivity, which are employed, in particular, for antistatic purposes, additives having an attractive coloration are also required for applications in which electrically semiconducting behaviour is sufficient, for example for the antistatic finishing of coatings or for use in certain security products which are subjected to an electric field, where the additives contribute to deflection of the electric field lines and thus to machine readability of the security products.

There is therefore still a need for transparent, electrically conducting interference pigments which have attractive bright interference colours and only a slight, in particular no, mass tone (absorption colour) and whose electrical properties can be adjusted specifically in the semiconducting region.

The object of the present invention is to provide a transparent interference pigment having a bright interference colour and defined electrically conducting properties which has no or only extremely low inherent absorption.

A further object of the present invention consists in providing a process for the preparation of the pigments described above.

In addition, an additional object of the invention consists in indicating the use of pigments of this type.

The object of the present invention is achieved by a transparent, electrically semiconducting, flake-form interference pigment comprising a layer of TiO$_{2-x}$, where 0.001≤x<0.05.

Furthermore, the object of the invention is achieved by a process for the preparation of a pigment of this type, in which a transparent, flake-form interference pigment which consists of TiO$_2$, or which consists of a coated transparent, flake-form support which has a layer of TiO$_2$ on its outer surface, is thermally treated in a gas phase with addition of a reducing gas over a period in the range from 5 to 60 minutes, where the TiO$_2$ is converted into TiO$_{2-x}$ and 0.001≤x<0.05.

The object of the present invention is additionally also achieved by the use of the interference pigment described above in paints, coatings, printing inks, plastics, sensors, security applications, floorcoverings, textiles, films, ceramic materials, glasses, paper, for laser marking, in heat protection, as photosemiconductor, in pigment-containing formulations, pigment preparations and dry preparations.

The present invention relates to a transparent, electrically semiconducting, flake-form interference pigment which comprises a layer which has the composition TiO$_{2-x}$, where: 0.001≤x<0.05. A composition of this type is not a titanium suboxide, but instead an oxygen-deficient titanium dioxide.

Since the formation of lower titanium oxides, titanium suboxides or Magnéli phases, such as TiO, Ti$_2$O$_3$, Ti$_3$O$_5$, Ti$_2$O, Ti$_3$O, Ti$_6$O or Ti$_n$O$_{2n-1}$, is always accompanied by inherent absorption of the layers comprising them, it is of particular importance in accordance with the present invention that the layer consisting of TiO$_{2-x}$ does not comprise lower titanium oxides, titanium suboxides or Magnéli phases of this type. Particular preference is given to a composition of the TiO$_{2-x}$ layer of TiO$_{1.96}$ to TiO$_{1.99}$, where: $0.01 \leq x \leq 0.04$.

The transparency T of interference pigments can be determined via lightness values L* of coatings which comprise the interference pigments on black/white paint cards. The measurements are carried out in the CIEL*a*b* colour space by means of a suitable measuring instrument, for example an ETA device (STEAG-ETA Optic GmbH, Inc.) The measurements are carried out at the mass tone angle 45°/90° in each case over the coated black and white paint card. The transparency T which can be determined is inversely proportional to the hiding power and can be determined in accordance with the equation:

$$T = (L^*_{45/90/white} - L^*_{45/90/black})/100.$$

(Determination of the hiding power HP by the Hofmeister method (Colorimetric evaluation of pearlescent pigments, "Mondial Coleur 85" congress, Monte carlo, 1985, in accordance with equation HP=100/($L^*_{45/90/white} - L^*_{45/90/black}$)).

The interference pigments according to the invention have a transparency, determined in accordance with the above-mentioned equation, of >0.35, preferably of >0.45 and in particular of >0.50.

The interference pigments according to the invention preferably have only a very slight and preferably no mass tone (absorption colour).

A measure of the mass tone is the above-mentioned measurement of the L* value at an angle of 45°/90° over the white paint card.

Since each mass tone reduces the reflection over white and thus the obtainable L* value and the interference pigments according to the invention may only have a very slight to no mass tone, the L* value over white at) 45°/90° (=45°/0° of the pigments according to the invention with a pigment application rate of 5 g/m$^2$ is at a value L*≤70 and is thus very high.

The term flake-form is applied to pigments or support materials if their outer shape corresponds to a flat structure which, with its top and bottom, has two surfaces which are approximately parallel to one another and whose length and width dimension represents the greatest dimension of the pigment or support material. The separation between the said surfaces, which represents the thickness of the flake, has, by contrast, a smaller dimension.

The length and width dimension of the pigments here is between 2 and 250 μm, preferably between 2 and 100 μm, and in particular between 5 and 60 μm. It also represents the value which is usually called the particle size of the interference pigments. This is not critical per se, but a narrow particle size distribution of the interference pigments according to the invention is preferred. A reduced fines content is particularly preferred. The content of particles having a particle size below 10 μm here is <5% by weight, based on the total weight of the pigments. The d$_{90}$ value is preferably in the range from 40 to 45 μm.

The particle size and particle size distribution can be determined by various methods which are usual in the art. However, preference is given in accordance with the invention to the use of the laser diffraction method in a standard method by means of a Malvern Mastersizer 2000, APA200 (product from Malvern Instruments Ltd., UK). These methods has the advantage that particle size and particle size distribution can be determined simultaneously under standard conditions.

The particle size and the thickness of individual particles can in addition be determined with the aid of SEM (scanning electron microscope) images. In these, particle size and geometrical particle thickness can be determined by direct measurement. In order to determine average values, at least 1000 particles are evaluated individually and the results are averaged.

The thickness of the interference pigments is between 0.2 and 4 μm, in particular between 0.3 and 2.5 μm.

The interference pigments according to the invention have a form factor (ratio of length or width to thickness) in the range from 2:1 to 500:1, preferably in the range from 20:1 to 300:1.

For the purposes of the present invention, a pigment is regarded as electrically semiconducting if it has a specific powder resistance in the range from 0.1 to 100 megaohm*cm. The interference pigments according to the invention preferably have a specific powder resistance in the range from 1 to 80 megaohm*cm, in particular in the range from 10 to 60 megaohm*cm. The values indicated here relate to field strengths of up to 10 V/mm, where the field strength relates to the applied measurement voltage.

The measurement of the specific powder resistance is carried out here by compressing an amount of in each case 0.5 g of pigment against a metal electrode with the aid of a weight of 10 kg with a metal ram in an acrylic glass tube having a diameter of 2 cm. The electrical resistance R is measured on the pigments compressed in this way. The layer thickness L of the compressed pigment gives the specific resistance p in accordance with the following relationship:

$$p = R * \pi * (d/2)^2 L \text{ (ohm*cm)}.$$

In a first, simplest embodiment, the transparent, flake-form interference pigment in accordance with the present invention consists of a flake-form TiO$_{2-x}$ particle, where $0.001 \leq x < 0.05$, in the above-mentioned dimensions. TiO$_{2-x}$, here may be both in the anatase and also in the rutile modification. The starting material for the preparation of such pigments are flake-form TiO$_2$ pigments, which are commercially available. TiO$_2$ flakes of this type can also be produced in accordance with the process described in WO 93/08237. The TiO$_2$ pigments prepared analogously to this process should, however, comprise no dissolved or undissolved colorants. They are produced from the corresponding, preferably inorganic, precursor material in a belt process, where the precursor is applied to the belt, converted into the oxidic form or into the oxide hydrate using acid, solidified and subsequently detached from the belt. The pigments obtained can be used in dried form or after calcination in air at elevated temperatures. The geometrical layer thickness of the flakes is adjusted via the application rate or wet layer thickness of the precursor layer, which is possible very precisely. The conversion of TiO$_2$ into TiO$_{2-x}$, in accordance with the present invention is described below.

Flake-form pigments of TiO$_{2-x}$, where $0.001 \leq x < 0.05$, have, like the corresponding flake-form TiO$_2$ pigments, a high refractive index n in the range from n=2.0 to 2.7. They are therefore capable of forming interference effects in application media, such as, for example, coatings, inks and plastics, whose base materials generally have refractive indexes in the range from 1.3 to 1.6, given a corresponding alignment. Due to the fairly high refractive-index differences between base materials (in general binders and assistants) and flake-form pigments and depending on the respective thickness of the flakes, the pigments are able to form clear interference colours in the application media pigmented therewith. The oxygen deficit in the $TiO_{2-x}$ layer, i.e. here, in the entire interference pigment, results, however, in a certain electrical conductivity, so that the interference pigment, besides the interference colour, also has a specific powder resistance in the range from 0.1 to 100 megaohm*cm, with the result that it exhibits semiconducting behaviour in the application medium and also imparts semiconducting behaviour of this type on the application medium given a sufficiently high pigment concentration.

However, it is comparatively complicated to produce support-free, crystalline $TiO_2$ flakes in certain dimensions and in particular their handling in further processes is difficult since their mechanical strength is low. It is therefore advantageous if the starting material used for the interference pigments according to the invention are flake-form interference pigments which have a layer of $TiO_2$ on a transparent support, where the layer of $TiO_2$ is present at least on the outermost surface of the support. This layer of $TiO_2$ is, in accordance with the present invention, converted into a layer of $TiO_{2-x}$, where $0.001 \leq x < 0.05$, as described below.

The interference pigment according to the invention is therefore preferably formed in such a way that the layer of $TiO_{2-x}$ with the above-mentioned restrictions for x is located on a transparent, flake-form support. In particular, the layer of $TiO_{2-x}$, completely surrounds the flake-form support.

The layer of $TiO_{2-x}$ in accordance with the present invention represents the outermost, optically active, inorganic layer on the flake-form support. Optically active layers in interference pigments are regarded as being layers which, owing to their optical thickness (product of geometrical thickness and refractive index of the material), are able to make an independent contribution to the interference colour. This is the case from a geometrical layer thickness of about 10 nm in the case of high-refractive-index materials ($n \geq 1.8$), by contrast only from a geometrical layer thickness of about 20 nm in the case of low-refractive-index materials ($n < 1.8$).

The optically active layers do not include, for example, conventional post-coatings, which may be both of an inorganic and also of an organic nature and enable better incorporation of pigments, if necessary, into the respective application media.

The transparent, flake-form supports employed in accordance with the invention are natural or synthetic mica flakes, kaolin, sericite or talc flakes, glass flakes, borosilicate flakes, $Al_2O_3$ flakes or mixtures of two or more thereof. Preference is given to the use of natural or synthetic mica. Besides transparency in the sense described above, flakes of this type are in addition also colourless or virtually colourless. Their length and width dimension is, as in the case of the interference pigments according to the invention themselves, in the range between 2 and 250 μm, preferably between 2 and 100 μm, and in particular between 5 and 60 μm. The thickness of the support flakes is in the range from 0.2 to 1.5 μm, in particular in the range from 0.3 to 1 μm.

In a preferred embodiment of the present invention, the interference pigment according to the invention consists of a flake-form support and a layer of $TiO_{2-x}$, where x is in the ranges mentioned above, surrounding the support. The layer of $TiO_{2-x}$ here is in crystalline form and can be both in the anatase modification and also in the rutile modification.

It is known to the person skilled in the art that a rutile modification of $TiO_2$ can be favoured by doping the layer with $SnO_2$ or by underlayering a $TiO_2$ layer with a layer of $SnO_2$. This also applies to the oxygen-deficient $TiO_{2-x}$ layer in accordance with the present invention. An additional layer of $SnO_2$ is therefore advantageously located between the transparent, flake-form support and the layer of $TiO_{2-x}$. In order to be able to influence the rutilisation of the layer of $TiO_{2-x}$, the layer of $SnO_2$ is located directly below the layer of $TiO_{2-x}$.

For the induction of a rutile crystal phase in the $TiO_{2-x}$ layer, it is sufficient if an $SnO_2$ layer having a very low layer thickness is present below the $TiO_{2-x}$ layer. The geometrical layer thickness of this $SnO_2$ layer is therefore in the range from 0.5 to 15 nm, in particular from 1 to 10 nm, by means of which this layer likewise represents an optically inactive layer in accordance with the above definition.

As an alternative or in addition to an $SnO_2$ layer of this type between $TiO_{2-x}$ layer and support, the $TiO_{2-x}$ layer may in a preferred embodiment be doped with 0.1 to 3 mol % of Sn.

$TiO_2$ layers on support flakes which, coated in this way, are intended to be employed as interference pigments can be produced homogeneously and in good quality in layer thicknesses up to about 170 nm by known processes. 2nd order interference colours can be produced well by means of them. For particularly intense 3rd order interference colours, however, a simple increase in the layer thickness of the $TiO_2$ layer by simple application of larger amounts of material and extended precipitation times of the titanium oxide hydrates onto the support is not sufficient, since the $TiO_2$ layer having a layer thickness increasing beyond 170 nm which is applied to the support becomes more porous and mechanically unstable.

In a particularly preferred embodiment of the present invention, the $TiO_{2-x}$ layer therefore consists of two or three part-layers, where the part-layers of $TiO_{2-x}$ are in each case separated from one another by an interlayer comprising a transparent material having a refractive index n, where n is <1.8 and the interlayer in each case has a geometrical layer thickness d 15 nm. A system which consists of two part-layers with one interlayer or of three part-layers with two interlayers with in each case an outer, final part-layer of $TiO_{2-x}$ is formed here on the flake-form support.

Suitable as material for the interlayers are transparent, colourless materials having a refractive index n 1.8 which can be applied well to a layer of $TiO_{2-x}$. Suitable materials are, in particular, $SiO_2$, $Al_2O_3$, silicon oxide hydrate, aluminium oxide hydrate, $MgF_2$, or mixtures of two or more thereof. The interlayer or interlayers particularly preferably consists of $SiO_2$. The low layer thickness of 0.5 to a maximum of 15 nm and the low refractive index mean that such layers count amongst the optically inactive layers in the sense of the above definition. They serve for mechanical stabilisation of the optically active $TiO_{2-x}$ layer and allow the construction of a high-quality $TiO_{2-x}$ layer in the region of 3rd order interference colours. The total geometrical thickness of $TiO_{2-x}$ layers stabilised in this way may significantly exceed 170 nm and may achieve a thickness of up to 350 nm.

As an example of a 3rd order green in the total layer thickness (300 nm), a division into 2 or 3 part-layers of $TiO_{2-x}$ is therefore possible, one part-layer of which (in the case of a total of two part-layers of $TiO_{2-x}$ with one interlayer) has a geometrical thickness of 160 nm and the second part-layer has a geometrical thickness of 140 nm, or a division into three part-layers of $TiO_{2-x}$, each of which has a geometrical thickness of 100 nm, with a total of two interlayers, which in each case separate the part-layers from one another.

However, an interlayer may also separate two $TiO_{2-x}$ part-layers of the same geometrical thickness from one another. This embodiment of the present invention is also preferred.

The division of the $TiO_{2-x}$ layer into part-layers has, besides the achievable higher colour strength of the interference colours and the increase in the mechanical strength of the entire layer of $TiO_{2-x}$, the further advantage that the electrical conductivity of the respective $TiO_{2-x}$ part-layers can be varied. Since each part-layer must be converted separately from $TiO_2$ into $TiO_{2-x}$, the different setting of the conditions for the requisite reduction reaction in each case means that the oxygen deficit in the individual part-layers may vary greatly. If the oxygen deficit in the $TiO_{2-x}$ part-layer(s) close to the support is reduced, the transparency of the entire pigment increases further without the overall conductivity of the interference pigment according to the invention being greatly reduced, since the conductivity of the pigments is essentially determined by the conductivity of the outer layer.

If, however, the $TiO_{2-x}$ part-layers close to the support are not subjected to a reducing treatment, x=0 in these part-layers (1st or 1st and 2nd part-layer of $TiO_{2-x}$ on the support). This means that these are one or two stoichiometric $TiO_2$ layer(s) and only the outer, final part-layer of $TiO_{2-x}$ meets the condition $0.001 \leq x < 0.05$. Interference pigments having this structure exhibit particularly high transparency at the same time as high colour strength and semiconducting electrical properties. This embodiment is particularly preferred, in particular, in the case of total layer thicknesses of the $TiO_{2-x}$ layer of greater than 200 nm.

In the case of the embodiments of the present invention described above, it is also preferred if a further $SnO_2$ layer, which is designed as described above and which favours the rutile modification in the subsequent $TiO_{2-x}$ part-layer, is applied at least below the first $TiO_{2-x}$ part-layer on the support, i.e. between part-layer and support.

An $SnO_2$ layer of this type is preferably applied below each $TiO_{2-x}$ part-layer. In addition, one, two or each of the $TiO_{2-x}$ part-layers may be doped with 0, 1 to 2 mol % of tin, as an alternative or in addition to the $SnO_2$ layer, which is particularly preferred.

The geometrical total thickness of the $TiO_{2-x}$ layer on the support is in accordance with the invention 50 to 350 nm, in particular 60 to 300 nm. The geometrical thickness of the outer, final $TiO_{2-x}$ part-layer on the support is 30 to 200 nm, preferably 50 to 150 nm.

In the case of all above-mentioned embodiments in accordance with the present invention, the rutile phase in the $TiO_{2-x}$ layer is preferred.

The present invention also relates to a process for the preparation of the interference pigments according to the invention having high colour strength and electrically semiconducting behaviour.

For the preparation of these pigments, a transparent, flake-form interference pigment which consists of $TiO_2$, or which consists of a coated transparent, flake-form support which has a layer of $TiO_2$ on its outer surface, is thermally treated in a gas phase with addition of a reducing gas over a period in the range from 5 to 60 minutes, where the $TiO_2$ is converted into $TiO_{2-x}$ and $0.001 \leq x < 0.05$.

x is particularly preferably set in the range $0.01 \leq x \leq 0.04$.

The starting material for the process according to the invention is a flake-form interference pigment which consists of $TiO_2$, or an interference pigment which consists of a flake-form support which is coated with a $TiO_2$ layer at least on its outer surface.

$TiO_2$ or $TiO_2$ layer here also denotes a material or layer which consists entirely or predominantly of titanium dioxide hydrate, since drying of the corresponding oxide hydrate layer without calcination does not always reliably lead to a titanium dioxide layer, but instead may consist of titanium dioxide hydrate or have a mixed composition comprising titanium dioxide and titanium dioxide hydrate. The applied and dried titanium dioxide layer may be subjected directly to the process according to the invention, but may also firstly be calcined at elevated temperature under air and subjected to a reducing treatment in accordance with the invention in a further step.

Interference pigments comprising $TiO_2$ are commercially available or can, for example, also be prepared by the process in accordance with WO 93/08237 described above.

The preparation of interference pigments which are coated at least with an outer layer of $TiO_2$ on a support is carried out by the conventional processes for the preparation of interference pigments, preferably by means of wet-chemical processes. These are described, for example, in the specifications DE 14 67 468, DE 19 59 998, DE 20 09 566, DE 22 14 545, DE 22 15 191, DE 22 44 298, DE 23 13 331, DE 25 22 572, DE 31 37 808, DE 31 37 809, DE 31 51 355, DE 32 11 602 and DE 32 35 017.

To this end, the substrate flakes are suspended in water. A $TiO_2$ layer is preferably applied here analogously to the process described in U.S. Pat. No. 3,553,001. In this process, an aqueous titanium salt solution is slowly added to a suspension of the pigment to be coated, the suspension is heated to 50 to 100° C., and the pH is kept virtually constant in the range from 0.5 to 5.0 by simultaneous addition of a base, for example an aqueous ammonium hydroxide solution or an aqueous alkali-metal hydroxide solution. When the desired $TiO_2$ layer thickness on the pigment flakes has been reached, the addition of the titanium salt solution and the base is terminated. Since the titanium salt solution is added so slowly that quasi-complete deposition of the hydrolysis product on the pigment flakes takes place, there are virtually no secondary precipitations. The process is known as the titration process.

If a layer of $TiO_2$ is applied which is divided into a plurality of part-layers with interlayers comprising a low-refractive-index material, the application of the low-refractive-index layer, which is preferably an $SiO_2$ layer (may consist of silicon dioxide, silicon dioxide hydrate or a mixture thereof), is carried out, for example, as follows:

For the application of an $SiO_2$ layer, a sodium or potassium water-glass solution is generally employed. The precipitation of a silicon dioxide or silicon dioxide hydrate layer is carried out at a pH in the range from 6 to 10, preferably from 7 to 9.

The support particle already coated in advance with a layer which consists of $TiO_2$ or $TiO_{2-x}$ is preferably suspended in water, and the suspension is heated to a temperature in the range from 50 to 100° C. The pH is set in the range from 6 to 10 and kept constant by simultaneous addition of a dilute mineral acid, for example of HCl, $HNO_3$ or $H_2SO_4$. A sodium or potassium water-glass solution is added to this suspension. As soon as the desired layer thickness of $SiO_2$ on the coated substrate has been obtained, the addition of the silicate solution is terminated, and the batch is stirred for a further 0.5 hours.

Alternatively, a hydrolytic coating with $SiO_2$ can also be carried out using organic silicon compounds, such as, for example, TEOS, in an acid- or base-catalysed process via a sol-gel reaction. This is likewise a wet-chemical process.

A TiO$_2$ layer is in each case applied as outermost optically active layer.

The conversion of the TiO$_2$ layer into TiO$_{2-x}$ is carried out in accordance with the invention under weakly reducing conditions in a gas stream. A reducing gas is added thereto, and the pigments are thermally treated therein over a period of 5 to 60 minutes.

If the starting pigment has a multilayered structure due to division of a TiO$_2$ layer into two or three TiO$_2$ part-layers with interruption of these part-layers in each case by an optically inactive interlayer comprising a low-refractive-index material, as described above, the conversion of the TiO$_2$ part-layers into TiO$_{2-x}$ part-layers can optionally be carried out by converting each of the part-layers separately into a TiO$_{2-x}$ layer whose composition meets the condition 0.001≤x<0.05 (the covering with all further layers is then in each case carried out after the reducing step), or alternatively not subjecting the TiO$_2$ part-layer close to the support or the two TiO$_2$ part-layers close to the support (1st and/or 2nd TiO$_2$ part-layer on the support) to a reducing treatment, so that x in these layers is equal to 0, while the outermost TiO$_2$ part-layer of the starting pigment is subjected to the reducing treatment, as described, and the condition 0.001≤x<0.05 applies in this layer. In the interest of high process economy, the latter variant of the process according to the invention is preferred if the resultant TiO$_{2-x}$ layer is overall to have a high geometrical layer thickness (>170 nm).

It is advantageous if the pigments are kept in motion during the reduction. The thermal treatment here can, for example, take place in a gas-tight tubular furnace with a gas stream being passed through or in a fluidised-bed reactor while a gas mixture is passed through the fluidised bed.

It is of particular importance in accordance with the invention that no lower titanium oxides, titanium suboxides or Magnéli phases are formed during the reduction of TiO$_2$. The reduction is therefore monitored under very weakly reducing conditions. Thus, for example, the content of reducing gas in the gas mixture is reduced compared with generally conventional reducing conditions.

The proportion of reducing gas in the gas mixture is in the range from 0.05 to 10% by vol., based on the total volume of the gas mixture. The proportion of reducing gas here is graduated depending on the reaction temperature.

The reaction temperature employed in accordance with the invention is in the range from 400° C. to 800° C. and is thus also comparatively moderate. The higher the reaction temperature is selected, the lower the proportion of reducing gas in the gas mixture must be in accordance with the invention in order that the formation of titanium suboxides does not occur. At a lower reaction temperature in the above-mentioned range, by contrast, the content of reducing gas in the gas mixture can be selected higher. Thus, the proportion of reducing gas in the gas mixture can be 5 to 10% by vol. at a reaction temperature of 400° C., whereas it may only be in the range from 0.05 to <5% by vol. at a reaction temperature of 800° C.

In particular, the reaction temperature and proportion of reducing gas in the gas mixture are in detail preferably matched as follows:

T≤550° C., preferably ≤500° C.: proportion of reducing gas: 5-10% by vol., in particular 5-8% by vol., T≤650° C., preferably ≤600° C.: proportion of reducing gas: 2-5% by vol., T≤750° C., preferably ≤700° C.: proportion of reducing gas: 1-2% by vol., T≤800° C., proportion of reducing gas: 0.05-1% by vol.

If the said conditions are observed for the reduction, there is no formation of titanium suboxides in the TiO$_2$ layer, but instead merely the formation of an oxygen deficit, so that the layer formed has the composition TiO$_{2-x}$, where 0.001≤x<0.05.

Only the respective anatase and/or rutile crystal modification is evident in the X-ray diffraction pattern of the corresponding pigment samples.

The reducing gas employed can be hydrogen, ammonia or hydrocarbon compounds having 1 to 4 C atoms (C$_1$-C$_4$). These are known to the person skilled in the art as reducing gases, but are generally otherwise employed with a higher proportion in the gas stream. Suitable C$_1$-C$_4$-hydrocarbon compounds are, in particular, methane, ethylene or propanone. Suitable carrier gases are, in particular, nitrogen or argon, which represent the other constituents of the gas mixture. Forming gas (N$_2$/H$_2$) having the above-mentioned low proportion of hydrogen is particularly preferably employed.

The interference pigments according to the invention can also be obtained by calcination of the starting pigments in vacuo. However, the reducing conditions and thus the final composition of the TiO$_{2-x}$ layer are more difficult to monitor in this case. For this reason, a reducing treatment in vacuo is not preferred.

After the thermal treatment, the interference pigments obtained are cooled and classified either under the reducing conditions present or under protective gas.

The present invention also relates to the use of the interference pigments according to the invention in paints, coatings, printing inks, plastics, sensors, security applications, floorcoverings, textiles, films, ceramic materials, glasses, paper, for laser marking, in heat protection, as photo-semiconductors, in pigment-containing formulations, pigment preparations and dry preparations.

Due to their high interference colour strength and transparency, the pigments according to the invention are highly suitable, merely owing to their colour properties, to be employed for the pigmentation of application media of the above-mentioned type. They are employed here in the same manner as conventional interference pigments. However, it is particularly advantageous that, besides the attractive colour properties, they also have semi-conducting electrical properties, which make them suitable, in particular, for use in industrial applications which require electrically semi-conducting coatings, but also very particularly for use in various security products, which occasionally require electrically conducting or semiconducting pigments in coatings in order to check security features. Security products of this type are, for example, bank notes, cheques, credit cards, shares, passports, identity documents, driving licences, entry tickets, revenue stamps, tax stamps, etc., to mention but a few.

On use of the pigments in paints and coatings, all areas of application known to the person skilled in the art are possible, such as, for example, powder coatings, automobile paints, printing inks for gravure, offset, screen, or flexographic printing and paints in outdoor applications. For the preparation of printing inks, a multiplicity of binders, in particular water-soluble, but also solvent-containing types, for example based on acrylates, methacrylates, polyesters, polyurethanes, nitrocellulose, ethylcellulose, polyamide, polyvinyl butyrate, phenolic resins, melamine resins, maleic resins, starch or polyvinyl alcohol, is suitable. The paints can be water- or solvent-based paints, where the choice of the paint constituents is subject to the general knowledge of the person skilled in the art.

The pigments according to the invention can likewise advantageously be employed for the production of electrically semiconducting plastics and films, more precisely for all applications known to the person skilled in the art which require electrical semiconductivity. Suitable plastics here are all standard plastics, for example thermosets and thermoplastics. The pigments according to the invention are subject to the same conditions here as conventional pearlescent or interference pigments. Special features of the introduction into plastics are therefore described, for example, in R. Glausch, M. Kieser, R. Maisch, G. Pfaff, J. Weitzel, Pearlescent pigments, Curt Vincentz Verlag, 1996, 83 ff.

The pigments according to the invention are also suitable for the preparation of flowable pigment preparations and dry preparations which comprise one or more pigments according to the invention, optionally further pigments or colorants, binders and optionally one or more additives. Dry preparations are also taken to mean preparations which comprise 0 to 8% by weight, preferably 2 to 8% by weight, in particular 3 to 6% by weight, of water and/or of a solvent or solvent mixture. The dry preparations are preferably in the form of pearlets, pellets, granules, chips, sausages or briquettes and have particle sizes of about 0.2 to 80 mm.

Due to their semiconducting properties, the interference pigments according to the invention can particularly advantageously be employed, for example, in decorative surfaces with an antistatic finish. Besides the electrical properties, which can be controlled well by the preparation process, the interference pigments according to the invention are transparent, have no inherent absorption and have high interference colour strength, so that they are ideal for use for the colouring of otherwise transparent, dielectric layers in the areas of application described above and do not have to be mixed with absorbent colorants or other effect pigments in order also to impart an attractive colouring on the application medium, besides the semiconducting properties, while retaining the transparency of the application medium.

The combination of optically attractive interference colours and semiconducting properties in a single pigment makes the interference pigments according to the invention particularly suitable for use in security products.

They have attractive interference colours in the gold, red, green, and blue region which were previously not available for semiconducting pigments. Since the pigments according to the invention are not absorbent effect pigments, they can be combined without problems and very advantageously in security applications with interference pigments which have the same layer structure and the same colouring of the interference colours, but comprise exclusively $TiO_2$ layers instead of the $TiO_{2-x}$ layer or the $TiO_{2-x}$ layers.

Thus, it is possible to create combined security features which consist, for example, of two adjacent fields, one of which contains an interference pigment in accordance with the present invention in a coating, while the adjacent field contains a conventional interference pigment of the same size, composition, layer structure and interference colour in a coating, with the only difference that none of the $TiO_2$ layer(s) of the comparative pigment meets the condition $TiO_{2-x}$ where $0.001 \leq x < 0.05$, but instead consists of stoichiometric $TiO_2$. Whereas the colouring and even the electron microscope photographs of the pigments in the first and second field entirely correspond, the two fields differ through their electrical properties, which, in the case of the field coated with the interference pigments according to the invention, can be identified as hidden security feature using detectors by, for example, measurement of the electrical resistance of the layer or by microwave absorption.

The interference pigments according to the invention are particularly preferably used in security products which are, for testing, subjected to the influence of an electromagnetic field. In an application of this type, the interference pigments according to the invention exhibit, for example, attenuation or also reflection of high-frequency electromagnetic fields and a specific change in the electrical flow density in an otherwise dielectric coating in the electric field. This is also the case at pigment concentrations below the percolation threshold. This is particularly advantageous in the case of checking of invisible security features for security products, since the interference pigments according to the invention can be used, for example, for deflecting field lines in electric fields, enabling local reinforcement of the electromagnetic field to be achieved (a so-called "hot spot"). With the aid of such hot spots, it is possible, for example, to cause electroluminescent substances to luminesce. The present invention therefore also relates to a security product which contains the interference pigments according to the invention.

The concentration of the interference pigments according to the invention in the respective application medium is dependent on the properties with respect to colouring and electrical conductivity desired therein and can in each case be selected by the person skilled in the art on the basis of conventional recipes.

Although the interference pigments according to the invention have attractive optical and electrically semiconducting properties and can thus be employed as the sole effect pigments in a very wide variety of applications, it is of course possible and also advantageous, depending on the application, to mix them if necessary with organic and/or inorganic colorants and/or electrically conducting materials and/or other, non-electrically conducting effect pigments. In addition, they can also be mixed with one another in various colour combinations or with various semiconducting properties if advantages for the application arise therefrom. The mixing ratios here are unlimited so long as the advantageous properties of the pigments according to the invention are not adversely affected by the admixed foreign pigments. The pigments according to the invention can be mixed in any ratio with additives, fillers and/or binder systems which are usual for the application.

The pigments according to the invention have optically attractive, bright interference colours of high colour strength and electrically semiconducting properties, are transparent and are virtually free or entirely free from inherent absorption into the region of near infrared light. Besides conventional applications of semiconducting pigments, they are therefore suitable, in particular, for the generation of visible and invisible multiple security features in security applications.

The present invention is intended to be explained below with reference to examples, but is not intended to be restricted thereto.

EXAMPLES

Examples 1-3

100 g of ground and classified mica (10-50 µm, $d_{90}$ 25 µm) are suspended in 1900 ml of demineralised water. 100 ml of a solution of 0.75 g of concentrated HCl and 2.2 g of $SnCl_4$ in water are slowly added to the suspension in an acidic medium at 75° C. with stirring. The pH is kept constant by simultaneous addition of sodium hydroxide solution. The mixture is subsequently stirred at 75° C. for a further 30 min., then coated with $TiO_2$ at pH 1.6 by slow addition of an aqueous $TiCl_4$ solution (400 g/l of $TiCl_4$) while keeping the pH constant using 32% sodium hydroxide solution. The coating is terminated when the following colour end points have been reached:

Example 1: Gold

Example 2: Red

Example 3: Blue

The reaction mixture is subsequently cooled to room temperature with stirring and neutralised. The pigments obtained are filtered off via a suction filter, washed with water and dried at 140° C.

The dried pigments are subjected to a thermal treatment under the conditions shown in Table 1.

Example 4

Preparation of a Pigment Having an Optically Inactive $SiO_2$ Interlayer:

100 g of ground and classified mica (10-50 µm, $d_{90}$ 25 µm) are suspended in 1900 ml of demineralised water. 100 ml of a solution of 0.75 g of concentrated HCl and 2.2 g of $SnCl_4$ in water are slowly added to the suspension in an acidic medium at 75° C. with stirring. The pH is kept constant by simultaneous addition of sodium hydroxide solution. The mixture is subsequently stirred at 75° C. for a further 30 min., then coated with $TiO_2$ at pH 1.6 by slow addition of an aqueous $TiCl_4$ solution (400 g/l of $TiCl_4$) while keeping the pH constant using 32% sodium hydroxide solution. The addition is terminated at the 2nd order green colour end point, the mixture is stirred for a further 30 min., and the pH is adjusted to 7.5 using sodium hydroxide solution.

An approx. 12% sodium water-glass solution in water is subsequently metered in at pH 7.5 until a total of 2.5 g of $SiO_2$ have been added. The mixture is then stirred for a further 15 min., a pH of 1.6 is established again using hydrochloric acid, and the addition of $TiCl_4$ solution is continued until the 3rd order green colour end point has been reached. The reaction mixture is subsequently cooled to room temperature with stirring and neutralised. The pigment obtained is filtered off via a suction filter, washed with water and dried at 140° C. The $SiO_2$ interlayer is located at about ⅔ of the geometrical $TiO_2$ layer thickness. The green interference pigment obtained is subjected to a thermal reaction in accordance with the conditions shown in Table 1.

TABLE 1

Thermal treatment under reducing conditions

| Example | Pigment from Ex. | Atmosphere | Temperature | Duration |
|---|---|---|---|---|
| 5 (comp.) | 1 | Air | 750° C. | 30 min. |
| 6 (comp.) | 2 | Air | 750° C. | 30 min. |
| 7 (comp.) | 3 | Air | 750° C. | 30 min. |
| 8 (comp.) | 4 | Air | 750° C. | 30 min. |
| 9 (inv.) | 1 | $N_2/H_2$(5% of $H_2$) | 500° C. | 30 min. |
| 10(inv.) | 2 | $N_2/H_2$(5% of $H_2$) | 500° C. | 30 min. |
| 11(inv.) | 3 | $N_2/H_2$(5% of $H_2$) | 500° C. | 30 min. |
| 12(inv.) | 4 | $N_2/H_2$(5% of $H_2$) | 500° C. | 30 min. |
| 13(inv.) | 2 | $N_2/H_2$(5% of $H_2$) | 500° C. | 10 min. |
| 14(inv.) | 2 | $N_2/H_2$(5% of $H_2$) | 450° C. | 30 min |
| 15(inv.) | 2 | $N_2/H_2$(5% of $H_2$) | 550° C. | 30 min |

TABLE 1-continued

Thermal treatment under reducing conditions

| Example | Pigment from Ex. | Atmosphere | Temperature | Duration |
|---|---|---|---|---|
| 16(inv.) | 3 | $N_2/H_2$(5% of $H_2$) | 450° C. | 30 min |
| 17(inv.) | 2 | $N_2$/2% of $C_2H_4$ | 500° C. | 30 min |
| 18(inv.) | 2 | $N_2$/2% of $C_2H_4$ | 550° C. | 60 min |
| 19(inv.) | 3 | $N_2$/2% of $C_2H_4$ | 500° C. | 60 min |
| 20(inv.) | 2 | $N_2$/0.5% of acetone | 500° C. | 30 min |
| 21(inv.) | 2 | $N_2/H_2$(1% of $H_2$) | 750° C. | 30 min |
| 22(inv.) | 3 | $N_2/H_2$(1% of $H_2$) | 750° C. | 30 min |
| 23(comp.) | 3 | $N_2$ | 750° C. | 30 min |

Example 24

Testing of the Electrical Properties in a Coating Film:

The pigments obtained after the thermal treatment in accordance with Table 1 are dispersed in NC lacquer (12% of collodium/butyl acrylate in a solvent mixture). PET films are coated with the coating preparation. The concentration of the pigments in the dry coating layer is 48.1% by weight, the layer thickness of the coating layer is 50 µm. After drying of the coating layers, the surface resistance is measured at a measurement voltage of 1000 V with the aid of a spring-tongue electrode (1 cm electrode separation, length 10 cm). The results are shown in Table 2. A comparative coating film without conducting pigment exhibits a specific resistance of $>10^{12}$ ohm.

Example 25

Testing of the Coloristic Properties:

Samples of the pigments in accordance with Table 1 are dispersed in NC lacquer in accordance with Example 24 (1.7% by weight of pigment in the lacquer). The lacquer is then applied to black/white cardboard with a wet layer thickness of 500 µm and dried. The dried layer has a thickness of 40 µm and a pigment mass concentration (PMC) of 12.3%. The cards are then measured in reflection using a spectrophotometer (ETA-Optik from Steag Optik) at the following angles:

45°/90° over black and white and 75°/95° over black, where the angle 90° represents the perpendicular to the plane of the card.

The L*, a*, b* values are then determined from the raw data of the measurements. The L* value over white is a measure of the mass tone of the pigment. The values are likewise shown in Table 2.

TABLE 2

Resistances and colorimetric values of the pigments

| Example | Colour | L*a*b*(b) | L*45°/90° (w) | Resistance |
|---|---|---|---|---|
| 5 (comp.) | gold | 152.0/6.8/76.0 | 85.8 | >1 Tohm |
| 6 (comp.) | red | 123.7/56/−7.2 | 85.6 | >1 Tohm |
| 7 (comp.) | blue | 104.4/−11.9/−85.9 | 88.6 | >1 Tohm |
| 8 (comp.) | green | 113.1/−49.8/37.6 | 83.7 | >1 Tohm |
| 9 (inv.) | gold | 150.2/6.1/74.3 | 82.9 | 14 Mohm |
| 10 (inv.) | red | 123.5/53.9/−4.7 | 80.8 | 18 Mohm |
| 11 (inv.) | blue | 102.7/−9.6/−86.8 | 79.5 | 20 Mohm |
| 12 (inv.) | green | 111.9/−47.8/85.9 | 81.9 | 45 Mohm |
| 13 (inv.) | red | 123.2/55.5/−5.5 | 83.7 | 33 Mohm |
| 14 (inv.) | red | 124.3/54.0/−4.8 | 80.0 | 27 Mohm |
| 16 (inv.) | blue | 102.7/−10.9/−87.0 | 78.9 | 50 Mohm |
| 17 (inv.) | red | 122.8/55.1/−5.0 | 83.3 | 22 Mohm |

TABLE 2-continued

Resistances and colorimetric values of the pigments

| Example | Colour | L*a*b*(b) | L*45°/90° (w) | Resistance |
|---|---|---|---|---|
| 21 (inv.) | red | 123.3/53.7/−4.5 | 81.0 | 14 Mohm |
| 22 (inv.) | blue | 102.3/−3.2/−89.6 | 80.0 | 33 Mohm |
| 23 (comp.) | purple | 92.0/31.4/−91.6 | 87.1 | >1 Tohm |

Example 26: Comparison

Strongly Reduced Pigment having a Dark Mass Tone:

The pigment from Example 3 (blue) is calcined at 900° C. under forming gas (5% of $H_2$) for 45 minutes, giving a pigment having a dark purple mass tone. Paint films and paint cards of the pigment are produced and measured in accordance with Examples 24 and 25. The resistance of the film is 9.8 Mohm, the L* value over white is 32. The low L* value indicates the strong mass tone and the high hiding power of the pigment. The electrical resistance of the paint film is only insignificantly lower than the resistances of the paint films comprising the transparent interference pigments according to the invention. For antistatic-dissipative coatings, all resistances are sufficiently low.

Example 27

Determination of the Oxygen Deficit of the Pigments:

The change in mass of pigment samples is determined with the aid of differential thermoanalysis, in which the pigment samples are heated on a balance under air from room temperature to 1000° C. at 10° C./min. The pigments lose their residual moisture up to 300° C. From 400° C., the reduced pigments increase in mass due to re-oxidation. The oxygen deficit is calculated from the increase in mass from 400° C.

The following pigments are investigated:
Example 7 (comp.) increase: −0.1%
Example 11 (inv.) increase: 0.3%
Example 16 (inv.) increase: 0.12%
Example 26 (comp.) increase: 0.66%

The pigments comprise about 48% by weight of $TiO_{2-x}$. Based on the $TiO_{2-x}$ content, the increase in weight is 0.625% in Example 11, 0.25% in Example 16 and 1.33% in Example 26. This gives rise to the following compositions:
Example 7: $TiO_2$
Example 11: $TiO_{1.96}$
Example 16: $TiO_{1.98}$
Example 26: $TiO_{1.93}$

The invention claimed is:

1. A transparent, electrically semiconducting flake-form interference pigment comprising a layer of $TiO_{2-x}$, where $0.001 \leq x < 0.05$.

2. An interference pigment according to claim 1, wherein the layer of $TiO_{2-x}$ is located on a transparent, flake-form support.

3. An interference pigment according to claim 2, wherein the layer of $TiO_{2-x}$ consists of two or three part-layers, where the part-layers are in each case separated from one another by an interlayer comprising a transparent material having a refractive index n, where n is <1.8 and the interlayer in each case has a geometrical layer thickness d≤15 nm, and where a system comprising two part-layers with one interlayer or comprising three part-layers with two interlayers with in each case an outer, final part-layer of $TiO_{2-x}$ is formed on the flake-form support.

4. An interference pigment according to claim 3, wherein $0.001 \leq x < 0.05$ in all part-layers of $TiO_{2-x}$.

5. An interference pigment according to claim 3, wherein $0.001 \leq x < 0.05$ only in the outer, final part-layer of $TiO_{2-x}$.

6. An interference pigment according to claim 3, wherein the interlayer consists of $SiO_2$, $Al_2O_3$, silicon oxide hydrate, aluminium oxide hydrate, $MgF_2$, or of mixtures of two or more thereof.

7. An interference pigment according to claim 2, wherein an additional layer of $SnO_2$ is located between the transparent, flake-form support and the layer of $TiO_{2-x}$ where the layer of $TiO_{2-x}$ is located directly on the layer of $SnO_2$.

8. An interference pigment according to claim 2, wherein the flake-form support is natural or synthetic mica flakes, kaolin, sericite or talc flakes, glass flakes, borosilicate flakes, $Al_2O_3$ flakes or mixtures of two or more thereof.

9. An interference pigment according to claim 1, wherein it consists of a flake-form support and a layer of $TiO_{2-x}$ surrounding the support.

10. An interference pigment according to claim 9, wherein the flake-form support is natural or synthetic mica flakes, Kaolin, sericite or talc flakes, glass flakes, borosilicate flakes, $AhO_3$ flakes or mixtures of two or more thereof.

11. An interference pigment according to claim 9, wherein an additional layer of $SnO_2$ is located between the flake-form support and the layer of $TiO_2$, where the layer of $TiO_2$-x is located directly on the layer of $SnO_2$.

12. An interference pigment according to claim 1, wherein the layer of $TiO_{2-x}$ is doped with 0.1 to 3 mol % of Sn.

13. A process for the preparation of an interference pigment according to claim 1, wherein a transparent, flake-form interference pigment which consists of $TiO_2$, or which consists of a coated transparent, flake-form support which has a layer of $TiO_2$ on an outer surface, is thermally treated in a gas phase with addition of a reducing gas over a period in the range from 5 to 60 minutes, where the $TiO_2$ is converted into $TiO_{2-x}$ and $0.001 \leq x < 0.05$.

14. A process according to claim 13, wherein the thermal treatment is carried out in a gas mixture which has a proportion of the reducing gas of 0.05 to 10% by vol.

15. A process according to claim 14, wherein the proportion of reducing gas in the gas mixture is 0.05 to <5% by vol. at a temperature of 800° C. and 5 to 10% by vol. at a temperature of 400° C.

16. A process according to claim 14, wherein the reducing gas is hydrogen, ammonia or a $C_1$-$C_4$-hydrocarbon compound, and the gas mixture furthermore comprises nitrogen or argon.

17. A process according to claim 16, wherein the hydrocarbon compound is methane, ethylene or propanone.

18. A process according to claim 13, wherein the thermal treatment is carried out at a temperature in the range from 400° C. to 800° C.

19. A method of using the transparent, electrically semiducting, flake-form interference pigments according to claim 1 comprising including said pigments according to claim 1 in paints, coatings, printing inks, plastics, sensors, security applications, floorcoverings, textiles, films, ceramic materials, glasses, paper, for laser marking, heat protection, or photosemiconductivity, in preparations.

20. A method according to claim 19, wherein the interference pigments are employed as a mixture with organic and/or inorganic colorants and/or electrically conducting materials and/or non-electrically conducting effect pigments.

21. A method according to claim 19, wherein the interference pigments are employed in security products which are subjected to the influence of an electromagnetic field.

22. A security product containing interference pigments according to claim 1.

* * * * *